United States Patent [19]

Hall

[11] 3,784,926

[45] Jan. 8, 1974

[54] MICROWAVE POWER AMPLIFIER

[75] Inventor: James A. Hall, Lynchburg, Va.

[73] Assignee: General Electric Company, Lynchburg, Va.

[22] Filed: May 10, 1972

[21] Appl. No.: 251,913

[52] U.S. Cl. .................................. 330/53, 330/61 A

[51] Int. Cl. .............................................. H03f 3/60

[58] Field of Search ............................ 330/61 A, 53; 331/107 G, 107 R, 77, 78, 96, 1.1

[56] References Cited

UNITED STATES PATENTS 3,051,932 8/1962 Cressey et al. .................... 331/77 X

*Primary Examiner*—Nathan Kaufman

[57] ABSTRACT

A relatively high power, good quality microwave power amplifier is provided by a transferred-electron device (TED) oscillator and a negative resistance power amplifier having an IMPATT diode. The oscillator and amplifier are coupled together by circulators, and low power, frequency modulated input signals are injected into the oscillator to vary the oscillator frequency. Signals from the oscillator are applied to the amplifier and amplified. High quality signals at frequencies above 6–18 gigahertz and at power levels greater than 1 watt can be obtained with this amplifier.

7 Claims, 6 Drawing Figures

FM NOISE DEVIATION OF 75MW 12GHZ TED INJECTION LOCKED OSCILLATOR
LOCKING POWER = −2DBM

AM/PM CONVERSION OF 75MW 12GHZ TED INJECTION LOCKED OSCILLATOR

POWER OUTPUT & NOISE MEASURE FOR 0.5 WATT 11GHZ SILICON IMPATT AMPLIFIER

FM NOISE DEVIATION OF 11 GHZ 0.5 WATT IMPATT AMPLIFIER

AM/PM CONVERSION OF 11 GHZ SILICON IMPATT AMPLIFIER

MICROWAVE POWER AMPLIFIER

BACKGROUND OF THE INVENTION

My invention relates to microwave devices, and particularly to such devices for producing relatively low noise microwave frequencies at relatively high power.

In the microwave art, communication services (both radio and cable) are requiring higher frequency signals to utilize more of the available spectrum,and are requiring higher powers to transmit such signals for longer distances without amplification. Persons skilled in the mircrowave art are well aware of the problems resulting from these requirements for higher frequencies and powers. These problems include, among others, obtaining as good an efficiency as possible; keeping the noise levels as low as possible; keeping undesired modulations as low as possible; and obtaining as much power as possible.

Accordingly, a primary and general object of my invention is to provide a new and improved microwave power amplifier.

Another object of my invention is to provide a new power amplifier for producing relatively high power, microwave frequency signals with improved noise and modulation characteristics.

While the TED injection locked oscillator and the IMPATT negative resistance amplifier have been available for some time, persons skilled in the art have not, as far as I am aware, conbined these two devices in a way to produce microwave energy efficiently, at a high power level, and with very little FM noise and phase modulation.

Accordingly, another object of my invention is to combine the TED injection locked oscillator with the IMPATT negative resistance amplifier in a novel microwave power amplifier circuit that produces new and unexpected results comprising high power output, and high gain; and very little FM noise and phase modulation.

SUMMARY OF THE INVENTION

Briefly, these and other objects are achieved in accordance with my invention by an injection locked oscillator having a transferred electron device (TED), and a negative resistance power amplifier having an IMPATT diode. The oscillator and amplifier are coupled together by circulators. Relatively low power input signals at the microwave frequencies are injected into the oscillator to vary the oscillator frequency. Intermediate power signals are derived from the oscillator and applied to the negative resistance amplifier. High power signals which are relatively free from noise and undesired modulation are derived from the amplifier for utilization.

BRIEF DESCRIPTION OF THE DRAWING

The subject matter which I regard as my invention is particularly pointed out and distinctly claimed in the Claims. The structure and operation of my invention, together with further objects and advantages, may be better understood from the following description given in connection with the accompanying drawing, in which:

DESCRIPTION OF THE PREFERRED EMBODIMENT

Figure 1:
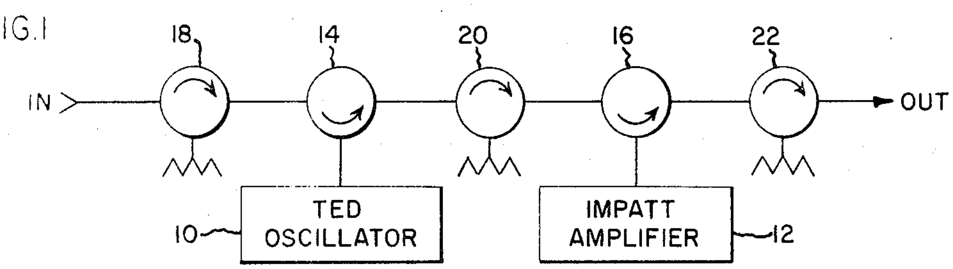
FIG. 1 shows a diagram of the new and improved microwave power amplifier in accordance with my invention.

FIG. 1 shows a diagram of a preferred embodiment of an improved microwave power amplifier in accordance with my invention. My improved amplifier comprises a transferred electron device (TED) oscillator 10 which is shown in block diagram form. Such an oscillator is known in the art, and may comprise solid-state power sources using, for example, small chips of gallium arsenide which produce high frequency microwave energy directly from a direct current input. My amplifier also comprises a negative resistance amplifier 12, which is shown in block diagram form. As known in the art, such an amplifier 12 may comprise a silicon or gallium arsenide IMPATT (an acronym for impact ionization and avalanche transit time) diode which is connected in a negative resistance amplifier circuit. The oscillator 10 and the amplifier 12 are coupled between an input and output in accordance with my invention by two circulators 14, 16. Circulators are also known in the art, and comprise two or more ports, each of which couples radio frequency energy to the next successive or adjacent port in the direction indicated by the arrow in the circulator diagram. Very little or no radio frequency energy travels in the direction opposite to the arrow. Thus, with respect to the circulator 14, energy applied to the lefthand port is coupled to the lower port; energy applied to the lower port is coupled to the righthand port; and energy applied to the righthand port is coupled to the lefthand port. While not essential, I also prefer to provide additional circulators 18, 20, 22 connected as shown with terminations (schematically indicated as resistors) to reduce reflected energy in the direction from the output back toward the input. For example, reflection of energy (such as might result from an impedance mismatch) from the circulator 14 back toward the input would be reduced by the termination connected to the circulator 18. But the circulator 18 would pass energy from the input toward the circulator 14. The circulators 20, 22 operate in the same fashion as the circulator 18. While FIG. 1 may seem simple, it is sufficient to explain to a person of ordinary skill in the art how to connect the injection locked oscillator 10 and the amplifier 12 in accordance with my invention.

In the operation of my invention, signals are applied to the input and passed through the circulator 18 to the lefthand port of the circulator 14. Typically, these signals are very low power (in the order of a few milliwatts, and are at the microwave frequency to be used (such as 10 or 12 gigahertz for example). These signals are usually frequency modulated with intelligence having a frequency range of 6 megahertz, for example, and occupy a bandwidth of 20 megahertz. Such a frequency range and bandwidth are typical of a microwave system that provides 1,200 or more voice frequency channels. The lower port of the circulator 14 applies or injects the input signals to the TED oscillator 10. The oscillator 10 is arranged so that it has a free-running oscillator frequency that is substantially equal to the center frequency of the applied signals; that is, the microwave frequency about which the intelligence signals cause the applied input signals to vary. As known in the art, these injected signals cause a frequency-determining element in the TED oscillator 10 to change so that the oscillator frequency follows exactly and with very little noise and distortion, the injected frequency. As the oscillator frequency changes, its output signal frequency, at a higher power level (in the order of 100 milliwatts), also changes and this higher power signal is applied back to the lower port of the circulator 14. The output power of the oscillator 10 is relatively independent of the injection signal level and frequency, and hence acts as a limiter. The signal from the oscillator 10 is coupled by the circulator 14 to its righthand port for application to the circulator 20. This signal passes through the circulator 20 to the circulator 16 which applies it through its lower port to the negative resistance IMPATT amplifier 12.

As also known in the art, the negative resistance IMPATT amplifier 12 amplifies the input signal by supplying additional power at the signal frequency, and returning this amplified signal back to the lower port of the circulator 16. This signal appears at the righthand port of the circulator 16, and is coupled through the circulator 22 to the output. The output signal is at a power level in the order of 1 watt or more. It will thus be seen that my invention, as shown in the diagram of FIG. 1, provides a new and improved microwave amplifier circuit which utilizes known devices (the injection locked TED oscillator 10, the negative resistance IMPATT amplifier 12, and the circulators 14, 16, 18, 20, 22) which are connected together in a novel configuration to provide a relatively high power microwave amplifier. As will be discussed in connection with the curves shown in the drawing, my amplifier circuit has improved qualities and characteristics which were not previously attainable in the art.

Figure 2:
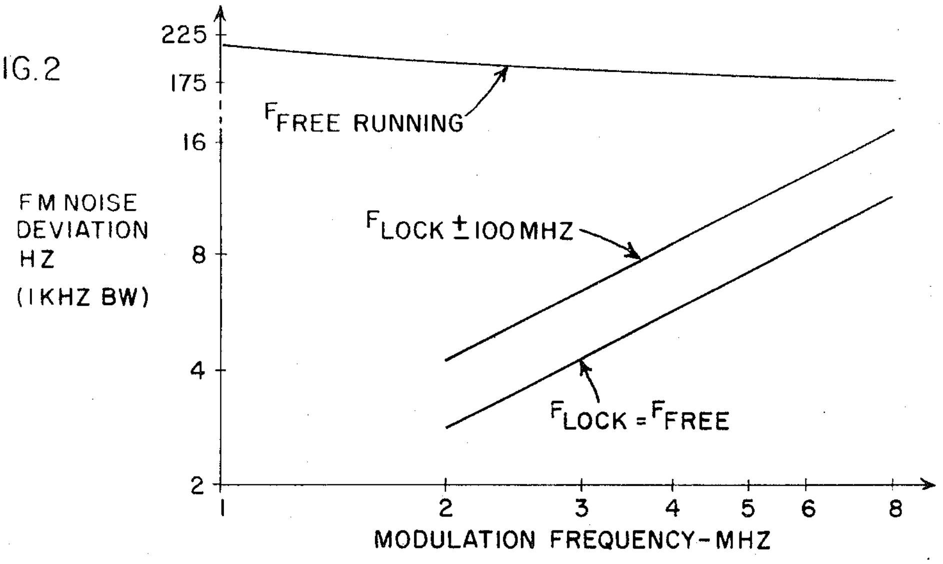
FIGS. 2 through 6 show curves illustrating the results obtainable with my microwave power amplifier.
Figure 3:
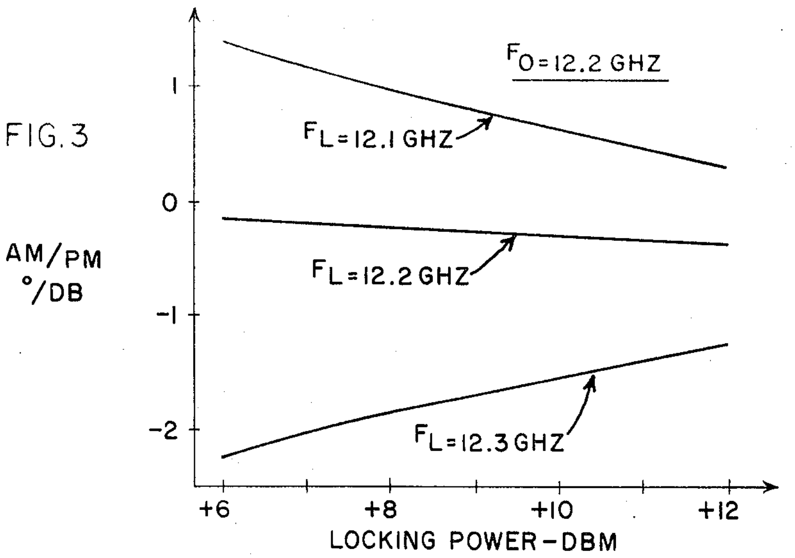

FIGS. 2 through 6 show curves illustrating the operation of my invention. Specifically, FIGS. 2 and 3 are curves showing the results obtained with the injection locked TED oscillator 10 of FIG. 1, and FIGS. 4, 5, and 6 show curves illustrating the operation obtained with the negative resistance IMPATT amplifier 12 of FIG. 1.

FIG. 2 shows the FM (frequency modulation) noise deviation produced by the injection locked TED oscillator 10, when the oscillator 10 is provided with a locking power of −2 dbm, an injection-locked frequency of 12 gigahertz, and modulation frequencies between 1 and 8 magahertz. In FIG. 2, it will be seen that the FM noise (in a 1 kilohertz bandwidth) decreases as the locking frequency approaches the free-running frequency of the oscillator 10. And, for a locking frequency which swings between plus or minus 100 megahertz, it will be seen that the FM noise is very acceptable. In connection with FIG. 2, it might also be pointed out that if the locking power is increased, as for example, if the input were in the order of 10 milliwatts, the FM noise deviation can be decreased even more. FIG. 3 shows the amount (in degrees) of phase modulation (PM) introduced by the oscillator 10 for each db change in amplitude (AM) introduced by the oscillator 10. There will usually be some amplitude modulation on the injection signal. In FIG. 3, it will be seen that if the injection signal or locking frequency $F_L$ is within plus or minus 100 megahertz of the oscillator free-running frequency $F_0$ (that is, locking frequencies $F_L$ of 12.1 and 12.3 gigahertz, and an oscillator free-running frequency $F_0$ of 12.2 gigahertz), then the amount of phase modulation introduced is very small over a relatively wide range of locking power. Hence, very little phase modulation is introduced by my oscillator 10.

Figure 4:
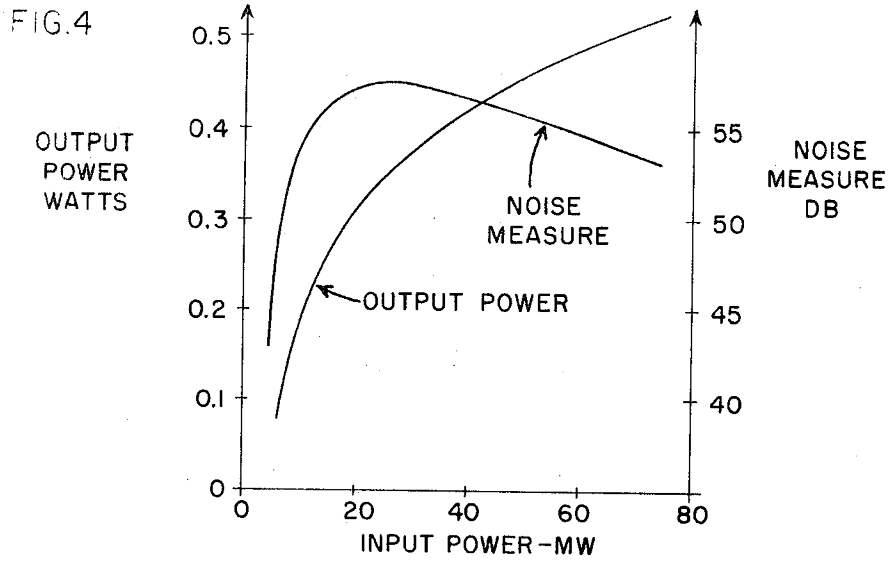
Figure 5:
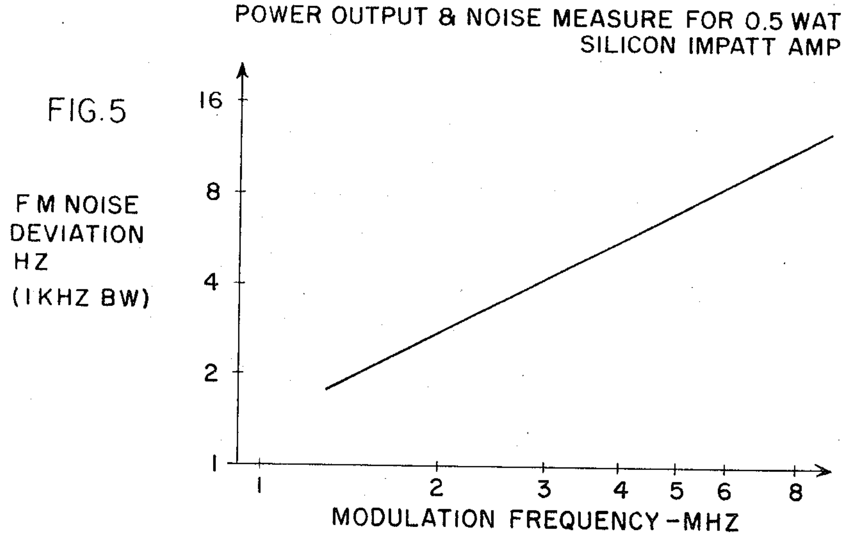
Figure 6:
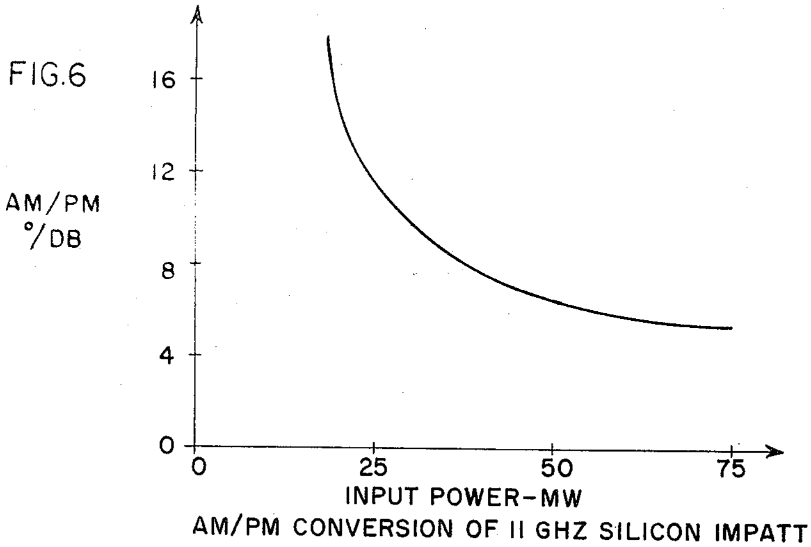

FIG. 4 shows how the output power of the amplifier 12 (plotted against the lefthand vertical axis) varies with input power. The output becomes fairly linear after an input power of 20 milliwatts is exceeded. The amplifier noise (plotted against the righthand vertical axis) first increases but then decreases after an input power of 20 milliwatts is exceeded. Hence, it is desirable to dirve the negative resistance IMPATT amplifier 12 with a fair amount of power. While the results of FIG. 4 were obtained with a one-half watt amplifier, comparable results can be obtained with a one watt amplifier. In FIG. 5, I show that the FM noise deviation introduced in the amplifier 12 increases with the modulation frequency as is normal in any amplifier; but that up to a modulation frequency of 6 megahertz, FM noise deviation remains below 8 Hertz. And, in FIG. 6, I show that the phase modulation (PM) introduced as a function of amplitude modulation (AM) by the negative resistance IMPATT amplifier 12 is high. However, since the amplitude modulation passed by the oscillator 10 is small because of the limiting effect of the oscillator 10, this is not a serious problem. Hence, the system in accordance with my invention introduces very little phase modulation, because the total phase modulation introduced by my system is essentially the relatively little phase modulation introduced by the oscillator 10. A fairly accurate appraisal of the total FM noise contributed by my complete power amplifier system can be obtained by combining the individual effects introduced by the oscillator 10 and the amplifier 12, as shown by the curves of FIGS. 2 and 5.

It will thus be seen that my invention provides a new and improved system or arrangement for providing fairly high power microwave frequencies. The oscillator 10 is set approximately at the input frequency and, therefore, introduces very little noise and phase modulation. Since this oscillator acts as a limiter, most of the amplitude modulation on the input signal is removed before being applied to the negative resistance amplifier 12. Therefore, the phase modulation introduced by the amplifier 12 is not critical, and the overall performance of my system provides high power output and high gain; and introduces very little FM noise and phase modulation. Thus, my invention combines the best features of available circuits in a novel fashion to give excellent power amplification at microwave frequencies. While I have described my invention with reference to a particular embodiment and operating parameters, it is to be understood that modifications may be made to my invention without departing from the spirit of the invention or from the scope of the claims.

I claim:

1. An improved microwave power amplifier arrangement comprising:

a. an input for relatively low power signals which have a center microwave frequency and which are modulated by intelligence;

b. an injection locked oscillator having a free-running frequency that is substantially equal to said center microwave frequency and that can be varied by an injection frequency signal;

c. a first circulator coupling said oscillator to said input so that said oscillator frequency is varied by said input signals;

d. a negative resistance amplifier having an IMPATT diode that provides amplified power in response to input signals;

e. a second circulator coupling said negative resistance amplifier to said oscillator so that said amplified power has the same frequency as the input signals applied to said amplifier;

f. and third means coupled to said amplifier for deriving said amplified power.

2. The improved microwave amplifier arrangement of claim 1 where said third means comprise a third circulator.

3. The improved microwave amplifier arrangement of claim 1 wherein the signals applied to said arrangement input are frequency-modulated.

4. The improved microwave amplifier arrangement of claim 3 wherein said oscillator has a TED device.

5. The improved microwave amplifier arrangement of claim 3 wherein said third means comprise a third circulator.

6. The improved microwave amplifier arrangement of claim 5, and further comprising a fourth circulator coupled between said first circulator and said input, and a fifth circulator coupled between said first and second circulators, said third, fourth, and fifth circulators being arranged to reduce reflected energy.

7. An improved amplifier for use at microwave frequencies comprising:

a. an input for receiving relatively low power signals having a center frequency;

b. first and second circulators each having three inputs;

c. an injection locked, transferred electron device oscillator having a free-running frequency substantially the same as said center frequency;

d. means respectively coupling said signal input, said oscillator, and an input of said second circulator to the three inputs of said first circulator so that said signals at said input are applied to said oscillator, and so that signals from said oscillator are applied to said second circulator;

e. an IMPATT device negative resistance amplifier;

f. an output for amplified signals;

g. and means coupling said IMPATT amplifier and said output to the other two inputs of said second circulator so that signals from said oscillator are applied to said IMPATT amplifier and so that signals from said IMPATT amplifier are applied to said output.

* * * * *